United States Patent
Lee et al.

(10) Patent No.: US 6,291,342 B2
(45) Date of Patent: Sep. 18, 2001

(54) METHODS OF FORMING TITANIUM NITRIDE COMPOSITE LAYERS USING COMPOSITE GASES HAVING INCREASING TICL$_4$ TO NH$_3$ RATIOS

(75) Inventors: Jang-eun Lee; Ju-hyuck Chung; Tae-wook Seo, all of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/767,523

(22) Filed: Jan. 23, 2001

Related U.S. Application Data (62) Division of application No. 09/356,928, filed on Jul. 19, 1999, now Pat. No. 6,207,557.

(30) Foreign Application Priority Data

| Jul. 22, 1998 | (KR) | 98-29527 |
| Mar. 18, 1999 | (KR) | 99-9184 |

(51) Int. Cl.$^7$ .................. H01L 21/4763; H01L 21/44
(52) U.S. Cl. .................. 438/648; 438/584; 438/618; 438/643; 438/680
(58) Field of Search ............... 438/648, 618, 438/675, 612, 584, 676, 680, 643, 649, 653, 681

(56) References Cited

U.S. PATENT DOCUMENTS

| 5,279,857 | 1/1994 | Eichman et al. | 427/255 |
| 5,308,655 | 5/1994 | Eichman et al. | 427/248.1 |
| 5,393,565 | * 2/1995 | Suzuki et al. | 427/255.2 |
| 5,514,908 | 5/1996 | Liao et al. | 257/751 |
| 5,552,340 | 9/1996 | Lee et al. | 437/190 |
| 5,573,978 | 11/1996 | Cho | 438/643 |
| 5,591,672 | 1/1997 | Lee et al. | 437/190 |
| 5,654,235 | 8/1997 | Matsumoto et al. | 438/643 |
| 5,665,640 | 9/1997 | Foster et al. | 438/680 |
| 5,705,442 | 1/1998 | Yen et al. | 438/653 |
| 5,716,870 | * 2/1998 | Foster et al. | 438/584 |
| 5,975,912 | 11/1999 | Hillman et al. | 438/680 |
| 5,994,181 | 11/1999 | Hsieh et al. | 438/239 |
| 6,005,291 | 12/1999 | Koyanagi et al. | 257/751 |
| 6,028,360 | 2/2000 | Nakamura et al. | 257/758 |
| 6,140,223 | 10/2000 | Kim et al. | 438/629 |
| 6,207,557 | * 3/2001 | Lee et al. | 438/684 |

FOREIGN PATENT DOCUMENTS

| 411067686A | 3/1999 | (JP) | H01L/21/28 |

* cited by examiner

*Primary Examiner*—Matthew Smith
*Assistant Examiner*—Igwe U. Anya
(74) *Attorney, Agent, or Firm*—Myers Bigel Sibley & Sajovec

(57) ABSTRACT

A method of forming a multilayer titanium nitride film hardly containing any Cl component by a multiple step chemical vapor deposition method, and a method of manufacturing a semiconductor device using the same are provided. In the present invention, a multilayer TiN film is formed by multiple step chemical vapor deposition (CVD) on a semiconductor substrate on which an underlayer is formed. In order to form the multilayer TiN film, an underlayer protective TiN film is formed by forming a first TiN film on the underlayer and NH$_3$ annealing the first TiN film. A main TiN film is formed by forming a second TiN film on the underlayer protective TiN film and NH$_3$ annealing the second TiN film. A source gas used in order to form the first TiN film has a smaller TiCl$_4$ to NH$_3$ gas flow ratio than a source gas for forming the second TiN film. In order to apply the multilayer TiN film to the fabrication of the semiconductor device, an insulating film having a contact hole is formed on a semiconductor substrate. A Ti film is formed on the inner wall of the contact hole. A multilayer TiN film is formed on the Ti film by the multiple step CVD method. A metal plug is formed on the multilayer TiN film.

2 Claims, 9 Drawing Sheets

METHODS OF FORMING TITANIUM NITRIDE COMPOSITE LAYERS USING COMPOSITE GASES HAVING INCREASING TICL₄ TO NH₃ RATIOS

This application is a continuation of prior Application Ser. No. 09/356,928, filed Jul. 19, 1999, now Pat. No. 6,207,557 the disclosure of which is hereby incorporated herein by reference.

BACKGROUND OF THE INVENTION

1. Field of the Invention

The present invention relates to a method of manufacturing a semiconductor device, and more particularly, to a method of forming a titanium nitride film and a method of manufacturing a semiconductor device using the same.

2. Description of the Related Art

An adhesive layer having a Ti/TiN structure is generally employed in order to improve the poor adhesive characteristic of a metal such as tungsten (W) for filling a contact hole, when a metal contact plug required for the metal wiring of a semiconductor device is formed.

In a conventional technology, a physical vapor deposition (PVD) method such as a sputtering method is used for forming the adhesive layer having the Ti/TiN structure. However, when the Ti/TiN structure is formed by the PVD method, a film having a poor step coverage is obtained. Therefore, in the case of forming a contact having a large aspect ratio, the overhang of the Ti/TiN film is severe at the entrance of the contact hole when the Ti/TiN film is used as the adhesive layer or a barrier layer. Accordingly, a large void is formed in the contact during a subsequent process of depositing a tungsten film. Also, when the Ti/TiN film is too thin on the bottom of the contact due to the poor step coverage of the Ti/TiN film, $WF_6$, gas, used as a source gas during a subsequent process of depositing the tungsten film, and Ti of the Ti/TiN film react, thus forming a nonconductor or vaporizing some part. Accordingly, the TiN film is lifted and peeled off. If so, the Ti/TiN film cannot serve as a barrier with respect to the $WF_6$ gas.

Therefore, a process of forming a TiN film by a chemical vapor deposition

In particular, the TiN film formed by the CVD method using $TiCl_4$ gas as a source gas is generally used as an adhesive layer of a metal film or a barrier film when a metal contact or a capacitor is formed since it is possible to obtain a good step coverage.

A large amount of chlorine (Cl) is included in the formed TiN film in the method of forming the TiN film by the CVD method using the $TiCl_4$ gas as the source gas. The TiN film containing a large amount of Cl shows a high resistivity. Also, since Cl permeates and damages the Ti film which is an underlayer, a high temperature rapid thermal nitration (RTN) process, or an $NH_3$ plasma process is required on the Ti film in order to prevent the Cl permeation.

When the high temperature RTN process or the $NH_3$ plasma process is performed with respect to the Ti film, the following problems occur. Firstly, the number of processes increases and a semiconductor manufacturing process becomes complicated since the above process is added. Secondly, additional equipment should be introduced since the above process is added. As a result, the burden of equipment investment increases. Thirdly, shallow junctions have recently started to be realized in semiconductor devices. Therefore, the allowed thickness of the Ti film deposited as the barrier film in the contact hole is restricted. However, a considerable amount of Ti is consumed in the Ti film by the high temperature RTN process or the $NH_3$ plasma process. As a result, it is not possible to secure a stable contact resistance since the amount of residing Ti becomes small.

SUMMARY OF THE INVENTION

To solve the above problem(s), it is an objective of the present invention to provide a method of forming a multilayer TiN film so as to lower the amount of Cl in a TiN film introduced when the TiN film is formed by a chemical vapor deposition (CVD) method such that the device does not deteriorate.

It is another objective of the present invention to provide a method of manufacturing a multilayer TiN film by which it is possible to simplify a process by reducing the number of process steps.

It is still another objective of the present invention to provide a method for manufacturing a semiconductor device using the TiN film formed by the above method.

Accordingly, to achieve the first and second objectives, there is provided a method of forming a multilayer TiN film by a chemical vapor deposition (CVD) method on a semiconductor substrate on which an underlayer is formed. In this method, an underlayer protective TiN film is formed on the underlayer. A main TiN film is formed on the underlayer protective TiN film.

The underlayer is a Ti film. At this time, $NH_3$ gas may be pre-flown on the surface of the Ti film before the step (a).

The step (a) comprises the steps of (a-1) forming a first TiN film on the underlayer to have a thickness of between 10 and 100 Å using a source gas composed of a mixture of $TiCl_4$ gas and $NH_3$ gas and (a-2) annealing the first TiN film in an $NH_3$ gas atmosphere.

The step (b) comprises the steps of (b-1) forming a second TiN film on the underlayer protective TiN film using a source gas formed of a mixture of $TiCl_4$ gas and $NH_3$ gas and (b-2) annealing the second TiN film in the $NH_3$ gas atmosphere.

The gas flow ratio of $TiCl_4$ to $NH_3$ is between 0.02 and 0.1 in the source gas.

The first and second TiN films are formed under a pressure of between 0.2 and 0.5 Torr and at a temperature of between 530 and 680° C.

The steps of annealing the first TiN film and the second TiN film are respectively performed at a temperature of between 530 and 680° C.

The step (c) of forming an oxygen diffusion preventing TiN film on the main TiN film can be further comprised after the step (b).

The step (c) comprises the steps of (c-1) forming a third TiN film on the main TiN film using a source gas composed of a mixture of $TiCl_4$ gas and $NH_3$ gas, to have a thickness of between 10 and 100 Å and (c-2) annealing the third TiN film in the $NH_3$ gas atmosphere.

The third TiN film is formed under a pressure of between 0.2 and 0.5 Torr and at a temperature of between 530 and 680° C.

In order to form the main TiN film, a TiN film is formed on the underlayer protective TiN film to have a thickness of between 10 and 100 Å using a source gas formed of a mixture of $TiCl_4$ gas and $NH_3$ gas. The TiN film is annealed in an $NH_3$ gas atmosphere. The above steps are repeated until the main TiN film having a desired thickness is obtained.

Also, to achieve the above objectives, a first TiN film covering the underlayer exposed on a semiconductor substrate is formed by a chemical vapor deposition (CVD) method using a source gas supplied in a first gas flow ratio having a predetermined $TiCl_4$ to $NH_3$ gas flow ratio. The first TiN film is annealed in an $NH_3$ gas atmosphere to form an underlayer protective TiN film. A second TiN film is formed on the underlayer protective TiN film by the CVD method, using a source gas supplied in a second gas flow ratio having a $TiCl_4$ to $NH_3$ gas flow ratio larger than the first gas flow ratio. The second TiN film is annealed in an $NH_3$ gas atmosphere to form a main TiN film.

The first gas flow ratio and the second gas flow ratio are selected to be between 0.02 and 0.1, respectively. The first gas flow ratio is selected to be between 0.02 and. 0.05.

The step of forming the first TiN film and the step of forming the second TiN film are respectively performed under a pressure of between 0.2 and 0.5 Torr and at a temperature of between 530 and 680° C.

The steps of annealing the first TiN film and the second TiN film are respectively performed at a temperature of between 530 and 680° C.

After forming the main TiN film, a third TiN film is formed on the main TiN film using a source gas supplied in a third gas flow ratio having a $TiCl_4$ to $NH_3$ gas flow ratio which is smaller than the second gas flow ratio. The third TiN film is annealed in an $NH_3$ gas atmosphere.

The third gas flow ratio is selected to be between 0.02 and 0.1.

Also, to achieve the above objectives, in the present invention, a first TiN film covering the underlayer exposed on a semiconductor substrate by the CVD method, using a source gas supplied in a first gas flow ratio having a predetermined $TiCl_4$ to $NH_3$ gas flow ratio. A second TiN film is formed on the first TiN film by the CVD method, using a source gas supplied in a second gas flow ratio having a $TiCl_4$ to $NH_3$ gas flow ratio which is larger than the first gas flow ratio. The first TiN film and the second TiN film are annealed in a $NH_3$ gas atmosphere.

To achieve the third objective, in a method of manufacturing a semiconductor substrate according to the present invention, an insulating film having a contact hole is formed on a semiconductor substrate. A Ti film is formed on the inner wall of the contact hole. A multilayer TiN film is formed by repeating a process of forming a TiN film on the Ti film by a CVD method using a source gas composed of a mixture of $TiCl_4$ gas and $NH_3$ gas and annealing the TiN film in an $NH_3$ gas atmosphere at least two times. A metal plug is formed on the multilayer TiN film.

According to the present invention, it is possible to obtain a densified multilayer TiN film sufficiently removed of the Cl component so that the device is not deteriorated. When the multilayer TiN film according to the present invention is used as a barrier film of a metal contact, it is possible to reduce the resistance of the contact and to omit an additional process such as a high temperature rapid thermal nitration (RTN) process for protecting an underlayer.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinafter, preferred embodiments of the present invention will be described in detail with reference to the attached drawings.

FIGS. 1A through 1F are cross sectional views showing processes of a method of forming a multilayer TiN film by a multiple step chemical vapor deposition (CVD) process according to a first embodiment of the present invention.

Figure 1A:
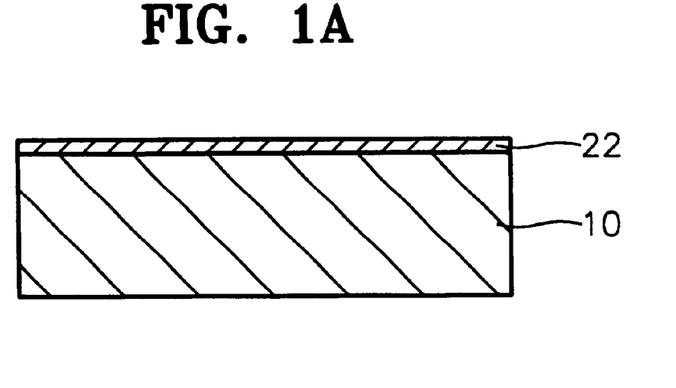
FIGS. 1A through 1F are cross sectional views for describing a method of forming a multilayer TiN film according to a first embodiment of the present invention.

Referring to FIG. 1A, an underlayer 10 such as a Ti film is formed on a semiconductor substrate (not shown). The underlayer 10 may be TaO or Pt. A first TiN film 22 is formed on the underlayer 10 by a chemical vapor deposition (CVD) method using a mixture of $TiCl_4$ gas and $NH_3$ gas as a source gas, to have a thickness of between 10 and 100 Å in the first step of forming a multilayer TiN film by a multiple step deposition. The deposition process is performed at a temperature of between 530 and 680° C. Here, the first TiN film 22 is formed on the underlayer 10 through thermal reduction of the $TiCl_4$ gas with the $NH_3$ gas in the source gas.

At this time, the flow rates of the $TiCl_4$ gas and the $NH_3$ gas, each of which compose the source gas, are controlled so as to obtain a $TiCl_4$ to $NH_3$ gas flow ratio of between 0.02 and 0.1. The reaction pressure during the formation of the first TiN film 22 is between 0.2 and 0.5 Torr.

Preferably, an $NH_3$ pre-flow step of providing the $NH_3$ gas on the surface of the underlayer 10 may be performed before forming the first TiN film 22. The $NH_3$ pre-flow step is performed for 60 seconds at a temperature of between 530 and 680° C. and under a pressure of 0.3 Torr.

Figure 1B:
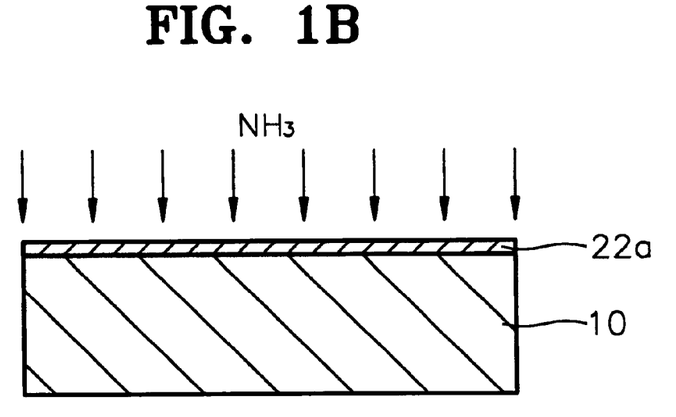

Referring to FIG. 1B, the first TiN film 22 is annealed in an $NH_3$ gas atmosphere. For this, the $NH_3$ gas is provided on the first TiN film 22 at the temperature of 530 and 680° C. As a result, a Cl component existing on the surface or the grain boundary of the first TiN film 22 is completely removed and the place from which Cl is removed is filled with an N component. Accordingly, the first TiN film 22 is densified. Therefore, an underlayer protective TiN film 22a which contains few Cl component is formed. Also, there are few Cl components in the interface between the underlayer protective TiN film 22a and the underlayer 10. For example, the $NH_3$ gas of 1,000 sccm is supplied for 60 seconds under a pressure of 3 Torr and at the temperature of between 530 and 680° C., for the $NH_3$ annealing.

The underlayer protective TiN film 22a obtained after the $NH_3$ annealing is sufficiently removed of the Cl component and the place from which Cl is removed is filled with the N component. Accordingly, the underlayer protective TiN film 22a is densified. Therefore, it is difficult for the Cl component to permeate the underlayer protective TiN film 22a from the $TiCl_4$ gas when a TiN film is formed using the $TiCl_4$ gas in a subsequent process. Therefore, it is possible to prevent the underlayer 10 from being damaged by the Cl component.

Figure 1C:
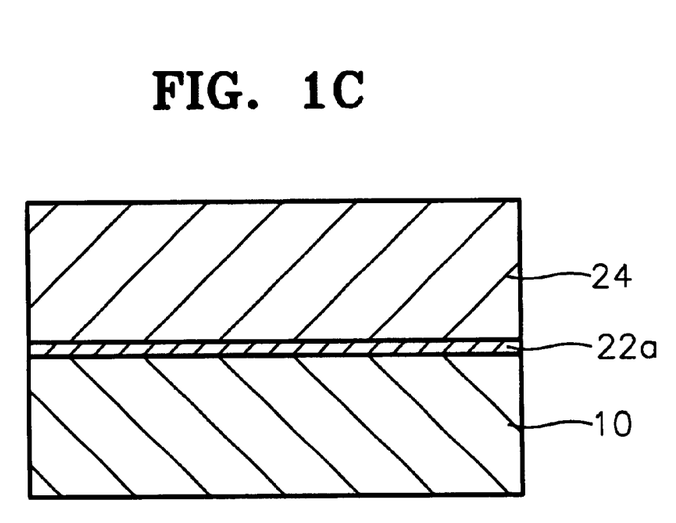

Referring to FIG. 1C, a second TiN film 24 is formed on the underlayer protective TiN film 22a to a predetermined thickness. The thickness of the second TiN film 24 is determined considering the thicknesses of the underlayer protective TiN film 22a according to the total thickness of the multilayer TiN film to be formed. The deposition conditions at this time are the same as those of forming the first TiN film 22 described with reference to FIG. 1A.

Figure 1D:
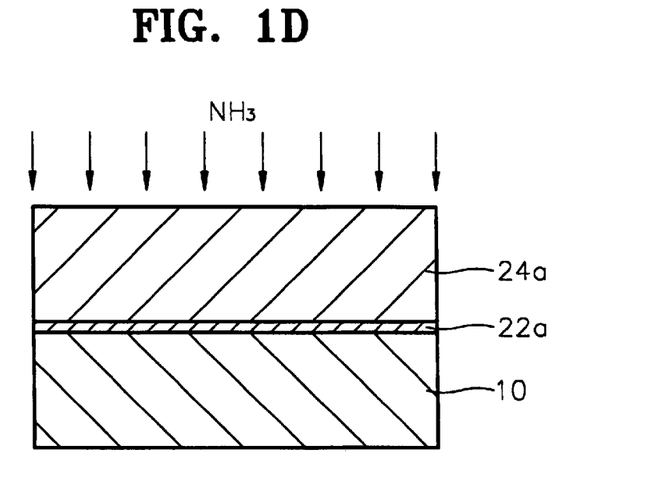

Referring to FIG. 1D, a main TiN film 24a removed of the Cl component contained in the second TiN film 24 and having a densified structure is formed by annealing the second TiN film 24 in the $NH_3$ gas atmosphere by the same method as that described with reference to FIG. 1B.

It is possible to prevent the Cl component from permeating into the underlayers of the main TiN film 24a during the subsequent process of depositing a TiN film on the main TiN film 24a using the $TiCl_4$ gas since the main TiN film 24a removed of the Cl component has a densified structure.

Figure 1E:
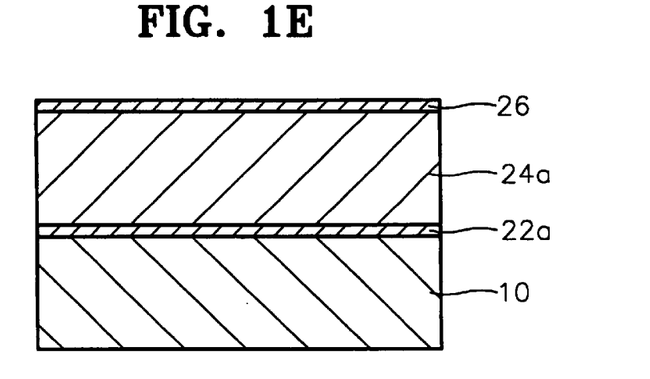

Referring to FIG. 1E, a third TiN film 26 is formed on the main TiN film 24a by the same method as that of forming the first TiN film 22 described with reference to FIG. 1A, to have the thickness of between 10 and 100 Å.

Figure 1F:
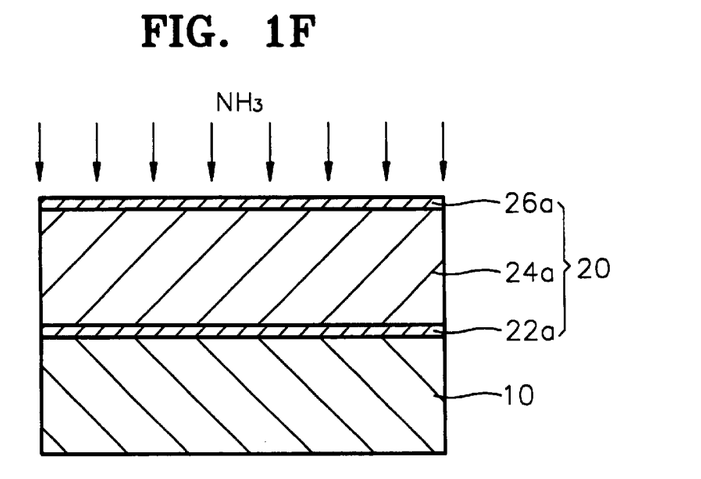

Referring to FIG. 1F, the Cl component is removed from the third TiN film 26 by annealing the third TiN film 26 in a $NH_3$ gas atmosphere, and a densified oxygen diffusion preventing TiN film 26a is formed by the same method as that described with reference to FIG. 1B.

The multilayer TiN film 20 formed of the underlayer protective TiN film 22a, the main TiN film 24a, and the oxygen diffusion preventing TiN film 26a is formed on the underlayer 10 by a multiple step CVD method.

As mentioned above, when the semiconductor substrate on which the multilayer TiN film 20 is formed is exposed to the air for a subsequent process after forming the multilayer TiN film 20 by the CVD method, it is possible to prevent oxygen in the air from permeating the multilayer TiN film 20 by the oxygen diffusion preventing TiN film 26a formed on the surface of the multilayer TiN film 20. Therefore, it is possible to prevent the resistivity from increasing due to the permeation of oxygen into the multilayer TiN film 20 including the oxygen diffusion preventing TiN film 26a formed by the multiple step CVD method.

In the above embodiment, the multilayer TiN film is formed by a three step deposition process. However, the present invention is not restricted to this.

For example, if the increase of the resistivity according to the permeation of oxygen is negligible, thus not deteriorating the device, the process of forming the oxygen diffusion preventing TiN film 26a can be omitted in order to simplify processes and to save expenses.

Also, it is possible to form a multilayer TiN film comprised of three or more layers by a multiple step CVD method as follows, instead of forming the multilayer TiN film by the three step deposition process as mentioned in the above embodiment.

Figure 2A:
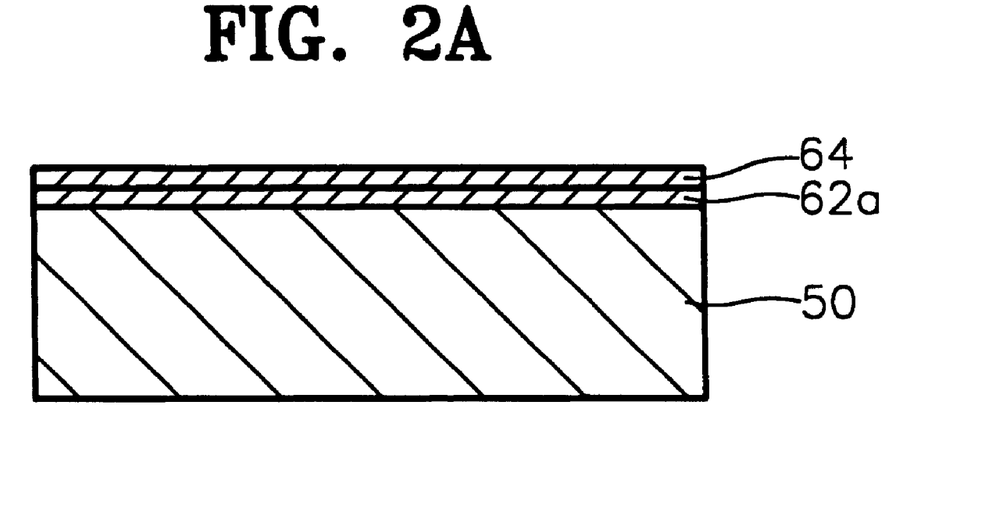
FIGS. 2A and 2B are cross sectional views for describing a method of forming a multilayer TiN film according to a second embodiment of the present invention.
Figure 2B:
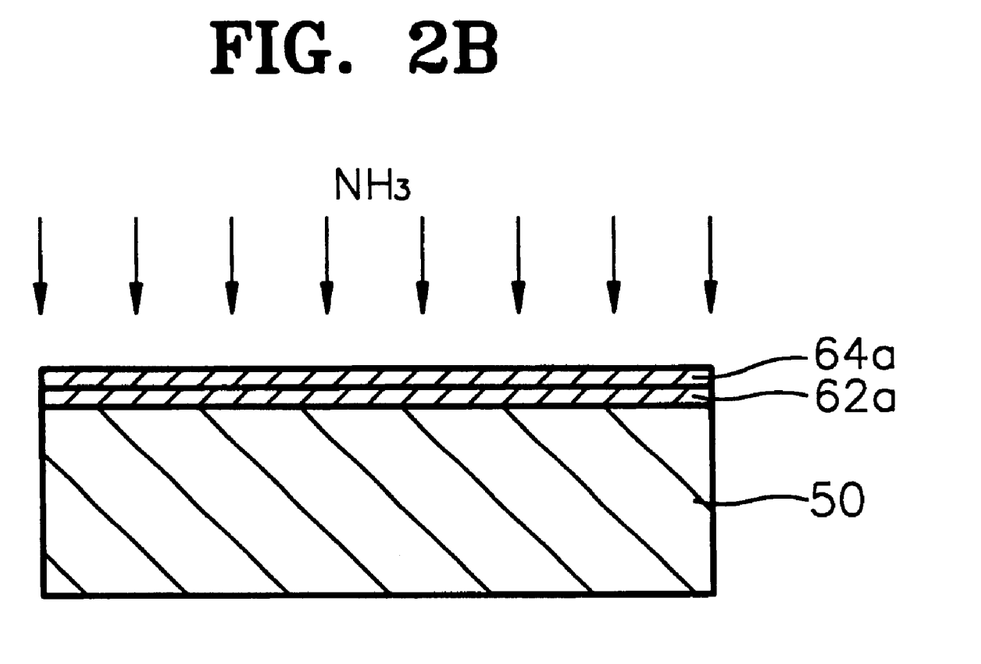

FIGS. 2A and 2B are cross sectional views showing processes of the method of forming the multilayer TiN film by the multiple step CVD process according to a second embodiment of the present invention.

Referring to FIG. 2A, after forming an underlayer 50 on a semiconductor substrate (not shown) by the same method as that described with reference to FIG. 1A, an underlayer protective TiN film 62a is formed on the underlayer 50 to have a thickness of between 10 and 100 Å. A second TiN film 64 is formed on the underlayer protective TiN film 62a by the same method as the method of forming the first TiN film 22 described with reference to FIG. 1A, to have a thickness of between 10 and 100 Å.

Referring to FIG. 2B, the Cl component contained in the second TiN film 64 is completely removed by annealing the second TiN film 64 in an $NH_3$ gas atmosphere by the same method as that describe with reference to FIG. 1B. Accordingly, a densified first main TiN film 64a is formed.

Then, a plurality of main TiN films are formed to have a desired thickness by sequentially forming a second main TiN film (not shown), a third main TiN film (not shown), . . . on the first main TiN film 64a by repeating the step of forming the TiN film of FIG. 2A and the $NH_3$ annealing step of FIG. 2B as many times as required with respect to the resultant material in which the first main TiN film 64a is formed.

The method according to the second embodiment, described with reference to FIGS. 2A and 2B, may require a longer process time than the method according to the first embodiment, described in FIGS. 1A through 1F. However, the TiN film obtained by the method according to the second embodiment contains less Cl component and is more dense.

FIGS. 3A through 3F are cross sectional views showing processes of the method of forming a multilayer TiN film by the multiple step CVD process according to a third embodiment of the present invention.

Figure 3A:
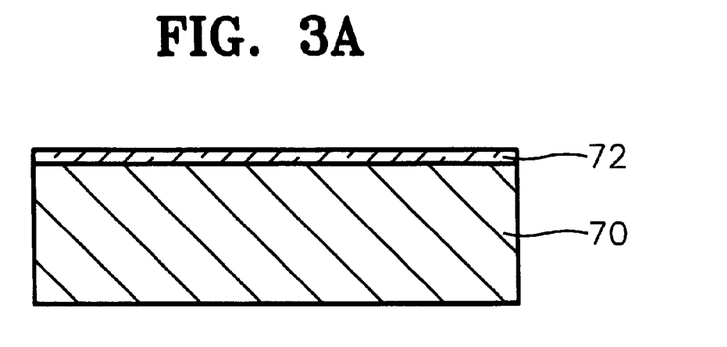
FIGS. 3A through 3F are cross sectional views for describing a method of forming a multilayer TiN film according to a third embodiment of the present invention.

Referring to FIG. 3A, an underlayer 70 such as a Ti film is formed on the semiconductor substrate (not shown). A first TiN film 72 is formed on the underlayer 70, to a thickness of between 10 and 100 Å, by the CVD method under a pressure of between 0.2 and 0.5 Torr and at a temperature of between 530 and 680° C., using a source gas composed of a mixture of the $TiCl_4$ gas and the $NH_3$ gas supplied in a first gas flow ratio of $TiCl_4$ to $NH_3$ selected from a value between 0.02 and 0.1 and having a relatively low Cl content. Preferably, the first gas flow ratio is selected from a value between 0.02 and 0.05, more preferably, from a value between 0.03 and 0.04.

Figure 3B:
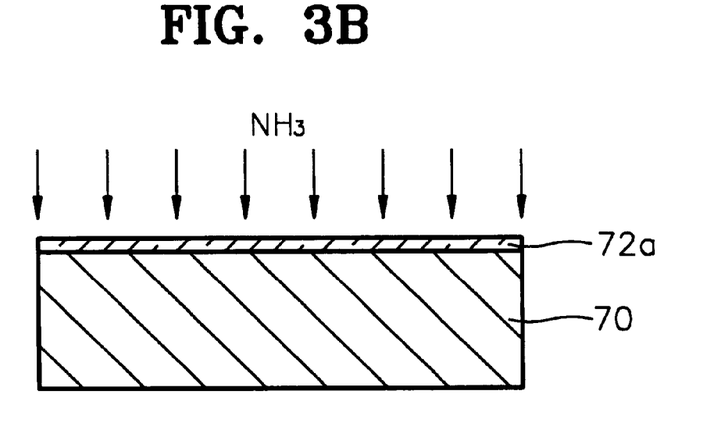

Referring to FIG. 3B, the first TiN film 72 is annealed in an $NH_3$ atmosphere at a temperature of between 530 and 680° C. As a result, the Cl component existing on the surface of the first TiN film 72 or the grain boundary in the first TiN film 72 is completely removed and the place from which Cl is removed is filled with an N component. Accordingly, the first TiN film 72 is densified. Therefore, an underlayer protective TiN film 72a which contains a small amount of the Cl component is formed on the underlayer 70. Also, there is a small amount of the Cl component in the interface between the underlayer protective TiN film 72a and the underlayer 70. For example, the $NH_3$ gas of 1,000 sccm is supplied for 60 seconds under the pressure of 3 Torr and at the temperature of between 530 and 680° C., for the $NH_3$ annealing.

Since the underlayer protective TiN film 72a is obtained by depositing the first TiN film 72 using a source gas containing a relatively low content of Cl and by sufficiently removing the Cl component residing in the TiN film 72, it is possible to contact the underlayer protective TiN film 72a, completely removed of the Cl component, to the underlayer 70. Also, in the underlayer protective TiN film 72a, the place from which Cl is removed is filled with an N component by the NH$_3$ annealing. Accordingly the underlayer protective TiN film 72a is densified. Therefore, it is difficult for the Cl component to permeate the underlayer protective TiN film 72a from the TiCl$_4$ gas when a TiN film is formed, using the TiCl$_4$ gas in a subsequent process, on the underlayer protective TiN film 72a. Therefore, it is possible to prevent the underlayer 70 from being damaged by the Cl component.

Figure 3C:
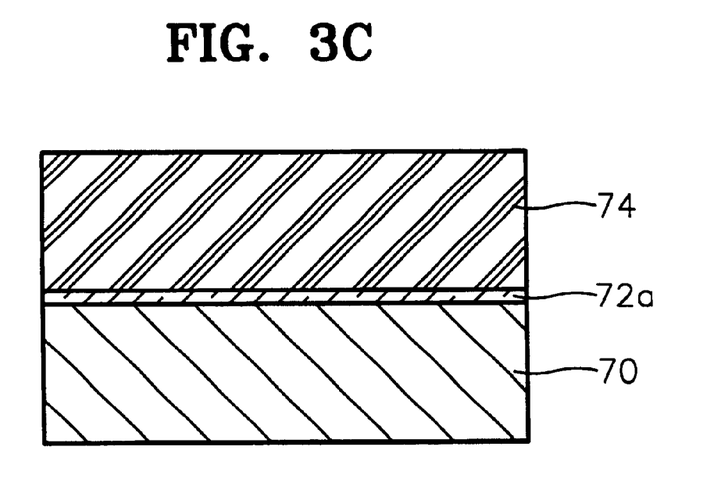

Referring to FIG. 3C, a second TiN film 74 is formed on the underlayer protective TiN film 72a to have a predetermined thickness, by the CVD method, using a source gas supplied in a second gas flow ratio of TiCl$_4$ to NH$_3$ selected from a value between 0.02 and 0.1 and larger than the first gas flow ratio, so as to have a larger content of Cl than in the source gas supplied in the first gas flow ratio. The thickness of the second TiN film 74 is determined considering the thicknesses of the underlayer protective TiN film 72a according to the total thickness of the multilayer TiN film to be formed. The deposition temperature and the pressure condition at this time are the same as those of forming the first TiN film 72 described with reference to FIG. 3A.

Figure 3D:
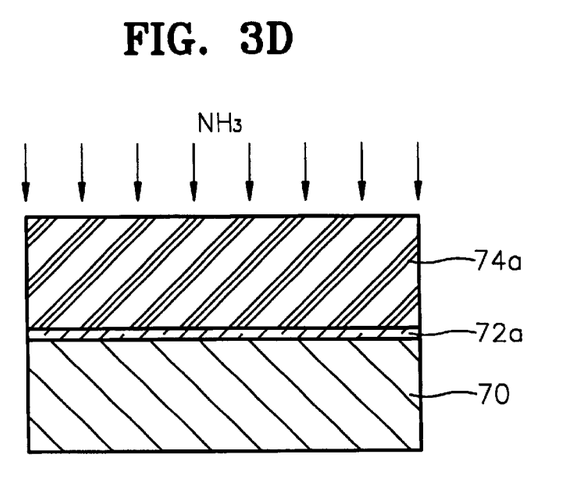

Referring to FIG. 3D, the second TiN film 74 is annealed in the NH$_3$ atmosphere and the Cl component contained in the second TiN film 74 is removed by the same method as that described with reference to FIG. 3B. Accordingly, a densified main TiN film 74a is formed.

Figure 3E:
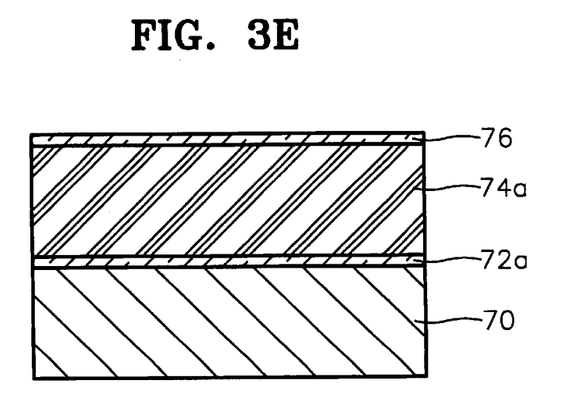

Referring to FIG. 3E, a third TiN film 76 is formed on the main TiN film 74a to have a thickness of between 10 and 100 Å by the same method as the method of forming the first TiN film 72 described with reference to FIG. 3A. A source gas supplied in a third flow ratio of TiCl$_4$ to NH$_3$ selected from a value between 0.02 and 0.1 and smaller than the second gas flow ratio so as to contain a smaller content of Cl than in the source gas supplied in the second gas flow ratio.

Figure 3F:
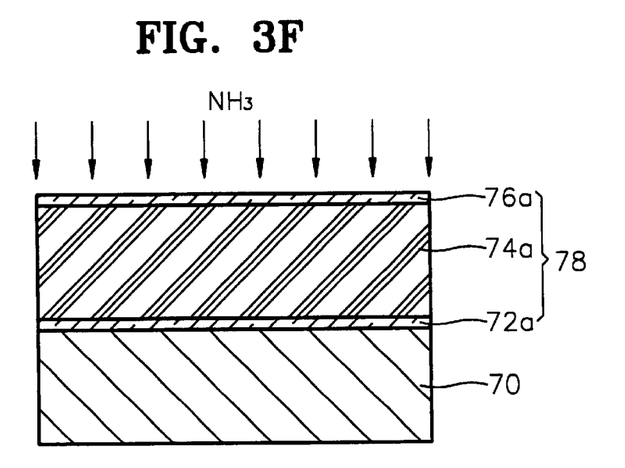

Referring to FIG. 3F, a densified oxygen diffusion preventing TiN film 76a is formed by annealing the third TiN film 76 in the NH$_3$ gas atmosphere and removing the Cl component from the third TiN film 76 by the same method as that described with reference to FIG. 3B.

A multilayer TiN film 78 comprised of the underlayer protective TiN film 72a, the main TiN film 74a, and the oxygen diffusion preventing TiN film 76a is formed on the underlayer 70 by the multiple step CVD method.

The step of forming the oxygen diffusion preventing TiN film 76a described with reference to FIGS. 3E and 3F can be omitted if necessary.

It is possible to prevent oxygen in the air from permeating the multilayer TiN film 78, since the multilayer TiN film 78 has a densified structure, when the semiconductor substrate on which the multilayer TiN film 78 is formed is exposed to air in order to perform a subsequent process. Therefore, it is possible to prevent the resistivity from increasing due to the permeation of oxygen in the multilayer TiN film 78 formed by the multiple step CVD method.

Figure 4A:
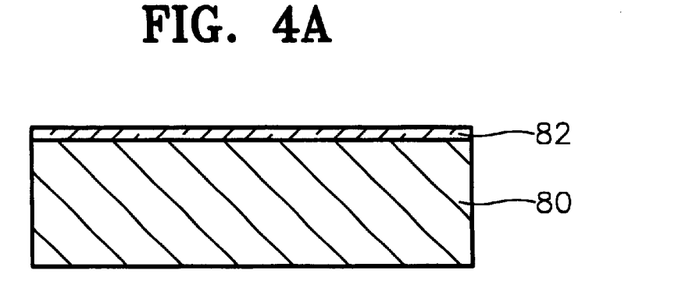
FIGS. 4A through 4C are cross sectional views for describing a method of forming a multilayer TiN film according to a fourth embodiment of the present invention.
Figure 4B:
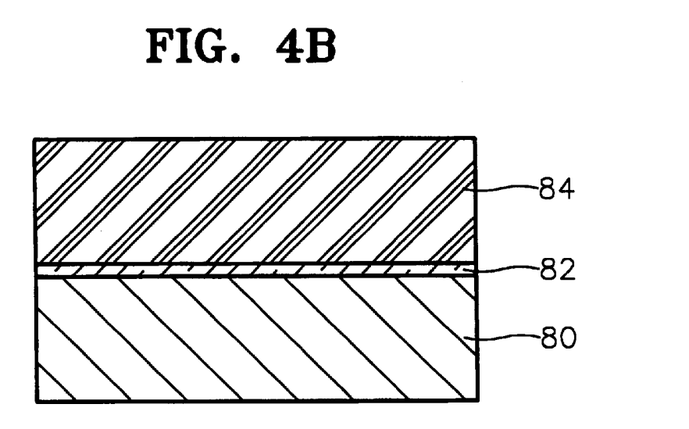
Figure 4C:
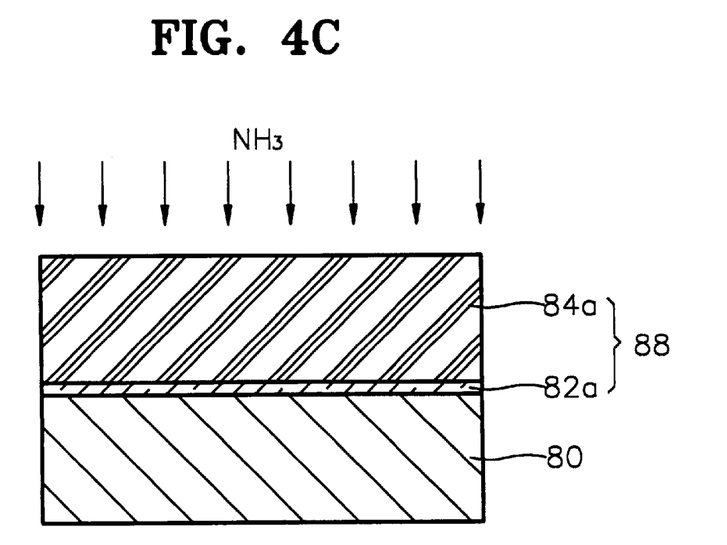

FIGS. 4A through 4C are cross sectional views showing processes of the method of forming a multilayer TiN film by the multiple step CVD method according to a fourth embodiment of the present invention.

Referring to FIG. 4A, an underlayer 80, for example, a Ti film is formed on a semiconductor substrate (not shown). A first TiN film 82 is formed on the underlayer 80 to have a thickness of between 10 and 100 Å by the CVD method under a pressure of between 0.2 and 0.5 Torr and at a temperature of between 530 and 680° C., using a source gas composed of a mixture of the TiCl$_4$ gas and the NH$_3$ gas supplied in a first gas flow ratio of TiCl$_4$ to NH$_3$ selected from a value between 0.02 and 0.1 and having a relatively low Cl component. Preferably, the first gas flow ratio is selected between 0.02 and 0.05, more preferably, from a value between 0.03 and 0.04.

Referring to 4B, a second TiN film 84 is formed on the first TiN film 82 by the CVD method, to have a predetermined thickness, using a source gas supplied in a second gas flow ratio of TiCl$_4$ to NH$_3$ selected between 0.02 and 0.1 and larger than the first gas flow ratio so as to have a larger content of Cl than in the source gas supplied in the first gas flow ratio. The thickness of the second TiN film 84 is determined considering the thicknesses of the first TiN film 82 according to the total thickness of the multilayer TiN film to be formed. The deposition temperature and the pressure condition at this time are the same as those of forming the first TiN film 82 described with reference to FIG. 4A.

Referring to 4C, the resultant obtained by sequentially stacking the first TiN film 82 and the second TiN film 84 is annealed in a NH$_3$ gas atmosphere at a temperature of 530 to 680° C. For the NH$_3$ annealing, 1,000 sccm of the NH$_3$ gas is supplied for 60 seconds under a pressure of 3 Torr and at the temperature of between 530 and 680° C. As a result, the Cl component existing on the surfaces or the grain boundaries of the first and second TiN films 82 and 84 is completely removed and the place from which Cl is removed is filled with the N component, thus obtaining a multilayer TiN film 88 comprised of the densified underlayer protective TiN film 82a and main TiN film 84a.

In the present embodiment, the step of NH$_3$ annealing the first TiN film 82 was omitted before forming the second TiN film 84. However, the structure of the multilayer TiN film 88 in which the surface and inside thereof is completely removed of the Cl component by the above method is densified. Therefore, although the multilayer TiN film 88 is exposed to air, it is possible to prevent oxygen from permeating the multilayer TiN film 88. Therefore, it is possible to prevent the resistivity from increasing due to the permeation of oxygen into the multilayer TiN film 88.

Figure 5:
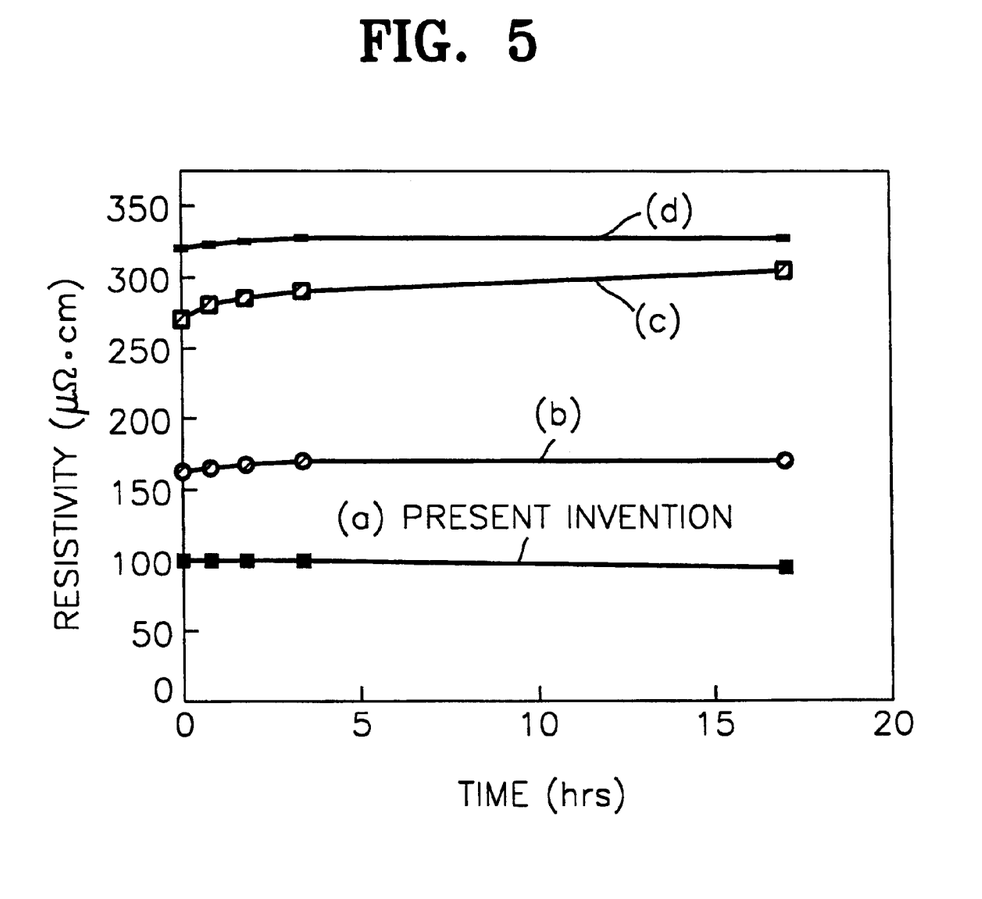
FIG. 5 is a graph showing the resistivities of a multilayer TiN film formed according to the present invention and TiN films formed by a conventional method.

FIG. 5 is a graph showing the result of comparing the resistivity of the multilayer TiN film formed by the multiple step CVD method according to the present invention with the resistivity of the TiN film formed by the conventional method.

In FIG. 5, (a) shows a case of a multilayer TiN film formed by a multilayer deposition method according to the present invention. To be specific, a multilayer TiN film having a thickness of 500 Å is formed by successively repeating the process of NH$_3$ annealing the TiN film obtained after forming the TiN film having a thickness of 50 Å by the CVD method 10 times. The characteristics denoted by (b) and (c) show cases in which the TiN film having the thickness of 500 Å is deposited in one step by the CVD method and the NH$_3$ gas is supplied to the TiN film. To be specific, (b) shows a case in which 1,000 sccm of NH$_3$ gas is supplied at a temperature of 680° C. and under a relatively high pressure of 3 Torr. (c) shows a case in which 400 sccm of the NH$_3$ gas is supplied at a temperature of 680° C. and under a relatively low pressure of 0.3 Torr. The characteristic denoted by (d) shows a case in which a TiN film having a thickness of 500 Å is deposited in one step by the CVD method, in which the step of providing the NH$_3$ gas is omitted.

It is noted from the result of FIG. 5 that the multilayer TiN film formed by the multiple step deposition method according to the present invention has much lower resistivity than the conventional methods.

As a result, it is noted that the multilayer TiN film formed by the multiple step CVD method according to the present invention contains an extremely small content of Cl and hardly undergoes increment of the resistivity due to substitution of oxygen when the multilayer TiN film is exposed to air.

Also, the Ti film is not damaged at all by the Cl component during the formation of the TiN film and the lifting of the TiN film is prevented by forming the multilayer TiN film on the Ti film by the multiple step CVD method according to the present invention without performing the RTN process or the $NH_3$ plasma process after forming the Ti film. As a result, it is possible to form a TiN film having low resistivity by forming the TiN film to have a small amount of Cl by the multiple step CVD method.

Therefore, it is possible to reduce contact resistance when the multilayer TiN film formed by the above method is employed as a barrier film in a metal contact.

FIGS. 6A through 6E are cross sectional views showing processes of a method of manufacturing a semiconductor device according to a preferred embodiment of the present invention.

Figure 6A:
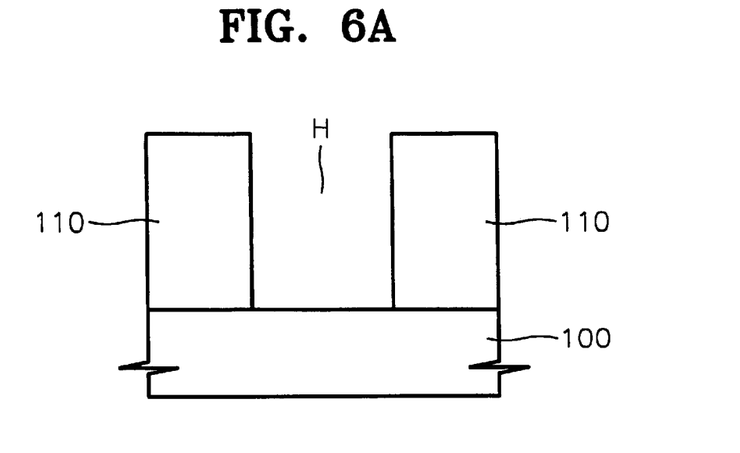
FIGS. 6A through 6E are cross sectional views for describing a method of manufacturing a semiconductor device according to a preferred embodiment of the present invention.

Referring to FIG. 6A, an interlayer dielectric film 110 having a contact hole H for exposing a part of a conductive layer (not shown), which is formed on a semiconductor substrate 100.

Figure 6B:
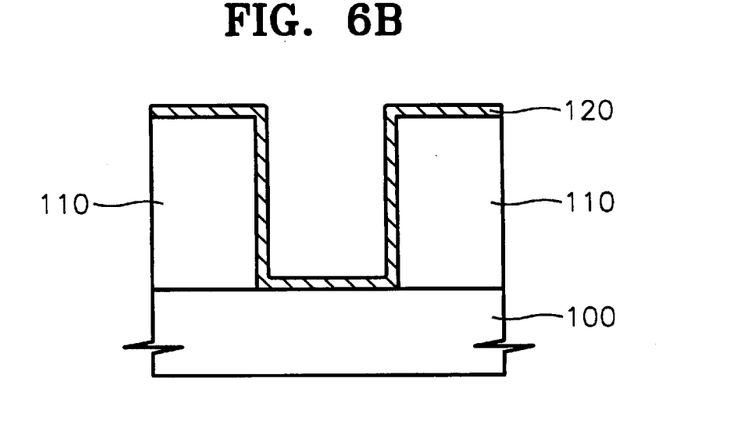

Referring to FIG. 6B, a Ti film 120 is formed on the resultant in which the contact hole H is formed by a sputtering method or the CVD method to have a thickness of about between 300 and 900 Å.

Figure 6C:
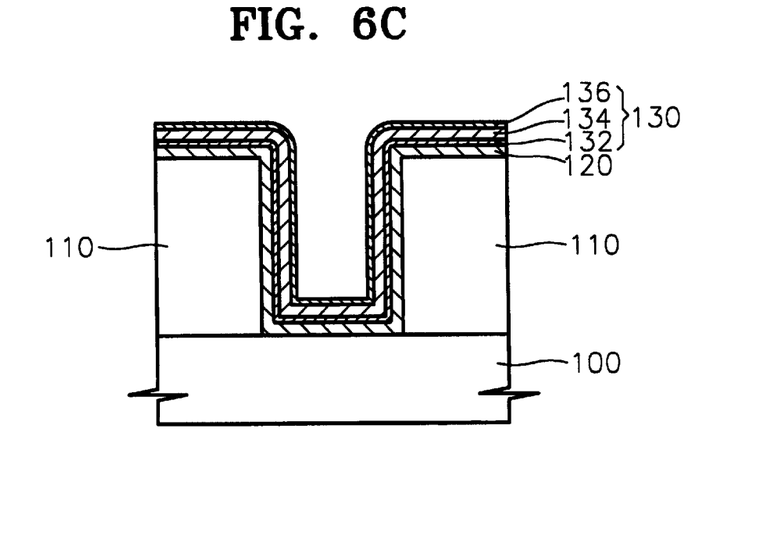

Referring to FIG. 6C, a multilayer TiN film 130 is formed on the Ti film 120 using a source gas comprised of $TiCl_4$ gas and $NH_3$ gas.

The multilayer TiN film 130 is obtained by forming a Ti film protective TiN film 132, a main TiN film 134, and an oxygen diffusion preventing TiN film 136 by the same method as that of the first embodiment. The main TiN film 134 can be formed of a single film formed by the single step CVD process. However, it may be formed of a multilayer film formed by the multiple step CVD process.

When the main TiN film 134 is formed of a multilayer film, the main TiN film 134 having a desired thickness is formed by repeating, as many times as required, the step of forming a TiN film on the Ti protecting TiN film 132, by the CVD method to have a thickness of between 10 and 100 Å and the step of $NH_3$ annealing the TiN film, thus removing the Cl component in the TiN film and densifying the TiN film.

In the present embodiment, the multilayer TiN film 130 is described to be comprised of the Ti protecting TiN film 132, the main TiN film 134, and the oxygen diffusion preventing TiN film 136. However, the present invention is not restricted to this.

For example, the oxygen diffusion preventing TiN film 136 can be omitted in order to simplify the process and to save expenses when the increase of resistivity according to the permeation of oxygen is negligible, thus not deteriorating the device.

Figure 6D:
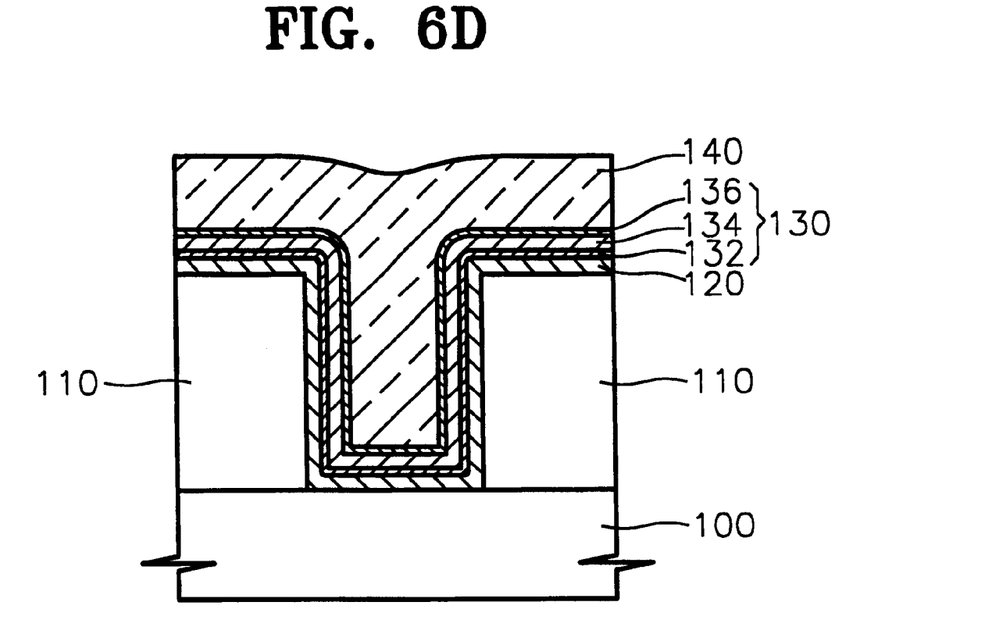

Referring to FIG. 6D, a metal layer 140 is formed by depositing a metal such as tungsten on the resultant in which the multilayer TiN film 130 is formed so as to fill the inside of the contact hole H.

Figure 6E:
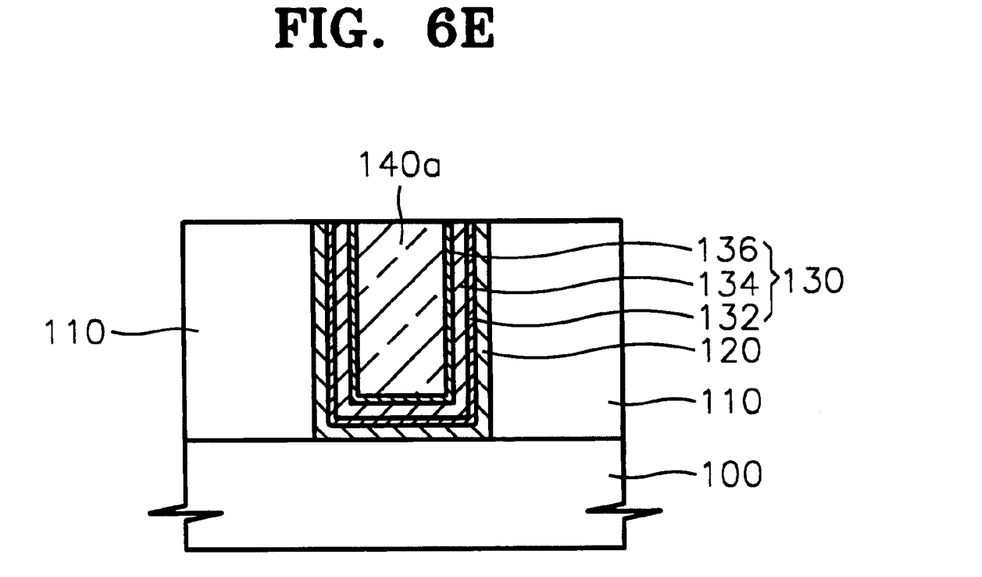

Referring to FIG. 6E, the upper surface of the interlayer dielectric film 110 is exposed by polishing the resultant in which the metal layer 140 is formed by a chemical mechanical polishing method, and a barrier film comprised of the Ti film 120 and the multilayer TiN film 130 and a metal plug 140a on the barrier film are formed in the contact hole H.

As mentioned above, when the multilayer TiN film formed by a multiple step CVD method is used as a TiN film constructing the barrier film of the Ti/TiN structure in order to form the contact of a semiconductor device, it is possible to prevent the Ti film from being damaged, to prevent the TiN film from being lifted by the multilayer TiN film which does not contain the Cl component, and to remarkably lower resistivity in the TiN film, without performing a subsequent process such as the RTN process after forming the Ti film.

In the method for manufacturing a semiconductor device according to the present embodiment, only the case in which the method of forming the multilayer TiN film according to the first embodiment is described. However, the present invention is not restricted to this. The multilayer TiN film formed by all methods provided in the detailed description of the present invention, and methods which can be varied within the scope of the present invention by anyone skilled in the art, can be applied to the process of forming the contact of the semiconductor device.

As mentioned above, when the multilayer TiN film is formed by the multiple step CVD method according to the present invention, it is possible to completely remove the Cl component in the TiN film and to make the TiN film dense. Therefore, it is possible to prevent the Cl component of the source gas $TiCl_4$ from permeating into the Ti film which is the underlayer of the TiN film, during the process of depositing the TiN film on the Ti film. Accordingly, it is possible to prevent the underlayer from being damaged by the Cl component and to prevent the TiN film formed on the underlayer from being lifted.

Also, since the multilayer TiN film formed by the multiple step deposition method according to the present invention does not contain the Cl component and is dense, the resistivity in the TiN film is remarkably low. Therefore, when the multilayer TiN film formed by the method according to the present invention is used as the barrier film of a contact, it is possible to reduce the resistance of the contact and to prevent voids from being formed in the contact since the step coverage of the barrier film is excellent.

The present invention is not restricted to the above embodiments, and it is clearly understood that many variations are possible within the scope and spirit of the present invention by anyone skilled in the art.

What is claimed is:

1. A thermal CVD method of forming titanium nitride composite layer, comprising the steps of:

depositing a first titanium nitride layer on a substrate by exposing the substrate to a first composite gas containing $TiCl_4$ and $NH_3$ at respective first levels that establish a first flow ratio of $TiCl_4$ to $NH_3$ in a range between about 0.02 and 0.05;

annealing the first titanium nitride layer by exposing the first titanium nitride layer to a gas consisting essentially of $NH_3$; and depositing a second titanium nitride layer on the first titanium nitride layer by exposing the first titanium nitride layer to a second composite gas containing $TiCl_4$ and $NH_3$ at respective second levels that establish a second flow ratio of $TiCl_4$ to $NH_3$ that is greater than the first flow ratio.

2. A thermal CVD method of forming titanium nitride composite layer, comprising the steps of:

depositing a first titanium nitride layer on a substrate by exposing the substrate to a first composite gas containing $TiCl_4$ and $NH_3$ at respective first levels that establish a first flow ratio of $TiCl_4$ to $NH_3$ in a range between about 0.02 and 0.05; and depositing a second titanium nitride layer on the first titanium nitride layer by exposing the first titanium nitride layer to a second composite gas containing $TiCl_4$ and $NH_3$ at respective second levels that establish a second flow ratio of $TiCl_4$ to $NH_3$ that is greater than the first flow ratio.

* * * * *